United States Patent [19]
Bosze

[11] Patent Number: 5,111,178
[45] Date of Patent: May 5, 1992

[54] ELECTRICALLY CONDUCTIVE POLYMER THICK FILM OF IMPROVED WEAR CHARACTERISTICS AND EXTENDED LIFE

[75] Inventor: Wayne P. Bosze, Riverside, Calif.

[73] Assignee: Bourns, Inc., Riverside, Calif.

[21] Appl. No.: 538,801

[22] Filed: Jun. 15, 1990

[51] Int. Cl.$^5$ .............................................. H01C 10/30
[52] U.S. Cl. ..................................... 338/160; 338/226; 338/310
[58] Field of Search ................. 338/160, 310, 226, 52, 338/176; 252/511, 514; 29/620; 427/101, 102

[56] References Cited

U.S. PATENT DOCUMENTS

| | | | |
|---|---|---|---|
| 3,299,389 | 1/1967 | Vercesi et al. | 338/309 |
| 3,329,920 | 7/1967 | Vercesi et al. | 338/300 |
| 3,717,837 | 2/1973 | MacLachlan | 338/160 |
| 4,350,741 | 9/1982 | Hasegawa et al. | 428/473.5 |
| 4,438,158 | 3/1984 | Eichelberger et al. | 427/101 |
| 4,694,272 | 9/1987 | Maisch | 338/138 |
| 4,732,802 | 3/1988 | Bosze et al. | 428/210 |

*Primary Examiner*—Marvin M. Lateef
*Attorney, Agent, or Firm*—Howard J. Klein

[57] ABSTRACT

An electrically conductive polymer film composition includes a polymeric resin, an electrically conductive substance intimately mixed in sufficient quantity with the polymeric resin to render the polymeric resin electrically conductive, and particles, such as fibers or spheres of appropriate size, admixed with the polymer composition in sufficient quantity so that in the cured polymer film the particles protrude from the surface of the film and render the surface uneven on a micro scale. The cured polymer film composition of the invention is incorporated in potentiometers and similar electric and electronic devices as a thick film where a contact wiper rides substantially continuously in contact with the protruding fibers.

34 Claims, 2 Drawing Sheets

ELECTRICALLY CONDUCTIVE POLYMER THICK FILM OF IMPROVED WEAR CHARACTERISTICS AND EXTENDED LIFE

BACKGROUND OF THE INVENTION

1. Field of the Invention

The present invention is directed to an electrically conductive polymer film to be used in potentiometers or similar electric and electronic applications where a moving or movable wiper contacts the polymer film. More specifically, the present invention is directed to an electrically conductive polymer film, usable in potentiometers and the like, having a plurality of particles admixed with the film which protrude from the surface of the film and render it uneven on a micro scale.

2. Brief Description of the Prior Art

Potentiometers and like electric devices where electric resistance is varied depending on the position of a contact wiper moving on the surface of an electrically conductive resistor layer, are old in the art. It is also old and well established in the art to form the electrically conductive resistive layer from a cured polymer film which contains sufficient amount of an electrically conductive material (such as carbon, graphite or metal powder) to make the polymer film conductive. Such state-of-the-art electrically conductive polymer films are typically deposited on ceramic, glass, plastic or paper-type substrates in an uncured form, and are typically cured thermally to provide a "thick" film of approximately 5 to 25 microns thickness. The cured thick film of the resistor is contacted in the potentiometer by a wiper contact, which in many applications moves (cycles) continuously, and sometimes rapidly. Ideally, the potentiometer would be expected to function properly and retain its original electric resistance characteristics even after several million cycles. However, until the present invention, this goal has been rather unattainable in the prior art.

The following United States patents describe or relate to the above-summarized technology: U.S. Pat. Nos. 3,299,389, 3,329,920, 4,100,525, 4,350,741, 4,694,272 and 4,728,755.

As it was noted above, a significant disadvantage of prior art polymeric thick films for potentiometer applications lies in the fact that the electric resistive characteristics of the device change during the life of the device and results in more or less resistive "noise". This is best explained with reference to FIG. 4 of the drawings appended to the present application for United States Letters Patent, where the surface profile (as measured by a profilometer) of a conductive thick film of a prior art potentiometer is shown. As can be seen, the surface is not absolutely even, rather it has "hills" and "valleys" which tend to be eroded and leveled during prolonged cycling of a contact wiper over the surface. The problem in this regard is that, as experience has shown, erosion of the uneven polymer film surface results in formation and accumulation of debris which is deposited particularly in the wiper turn-around locations. Other problems related to wear of the film and the wiper also occur, these include surface cracking or peeling. Generally speaking, it was thought in the prior art that a solution to the above-noted problems is to make the surface of the electrically conductive thick film of the potentiometer smoother and more even, and efforts were made in this regard.

Nevertheless, formation and accumulation of debris and related phenomena in prior art potentiometers (and like instruments) having conductive polymeric thick film resistors and moving contact wipers have presented a major problem in the art, and rendered it difficult or unattainable to fabricate potentiometers which had substantially unimpaired performance even after approximately one million cycles or prolonged dithering of the contact wiper. The present invention provides a solution to this problem, and provides an electrically conductive polymeric thick film for application in potentiometers and like devices which function, without significant degradation in performance, for several million cycles.

SUMMARY OF THE INVENTION

It is an object of the present invention to provide an electrically conductive polymer film composition which is suitable for application in potentiometers, joy sticks and similar sensor-type devices and which permits substantially unimpaired performance of low and stable contact resistance, for several million cycles of movement of a contact wiper on the conductive polymer film.

The foregoing and other objects and advantages are attained by an electrically conductive polymer film composition which comprises a polymeric resin, and an electrically conductive substance intimately mixed in sufficient quantity with the polymeric resin to render the polymeric resin electrically conductive. As a novel feature of the electrically conductive film composition, particles (such as fibers or spheres of appropriate size) are admixed with the polymer composition in sufficient quantity so that in the cured polymer film the particles protrude from the surface of the film and render the surface uneven.

In one aspect, the invention is the uncured polymer composition itself which contains the particles (fibers or spheres) intimately admixed in the composition. This composition is suitable for application as a thick film, usually of approximately 3 to 25 micron thickness, on a solid part (usually plastic) and can be cured, usually by thermosetting, into the polymer film which forms the conductive resistor layer of a potentiometer or like device.

In another aspect, the invention is the electrically conductive cured polymer film which has the particles, fibers or spheres, protruding from its surface so that on a micro scale the surface is uneven and the contact wiper of a potentiometer rides substantially continuously in contact with the particles. Experience has shown that the cured polymer film of the invention when used in a potentiometer, has an extended life of substantially unimpaired performance of low and stable contact resistance for several million cycles of movement or dither of the wiper.

In still another aspect, the invention is a potentiometer, joy stick or like electric or electronic sensor device which incorporates the electrically conductive cured polymer film of the invention, and which has a wiper in contact with the film, riding substantially continuously in contact with the protruding particles, and which provides greatly extended life for several million cycles of wiper movement or prolonged dither.

The features of the present invention can be best understood together with further objects and advantages by reference to the following description, taken in connection with the accompanying drawings, wherein like numerals indicate like parts.

DESCRIPTION OF THE PREFERRED EMBODIMENTS

The following specification taken in conjunction with the drawings sets forth the preferred embodiments of the present invention The embodiments of the invention disclosed herein are the best modes contemplated by the inventor for carrying out his invention in a commercial environment, although it should be understood that various modifications can be accomplished within the parameters of the present invention.

Figure 1:
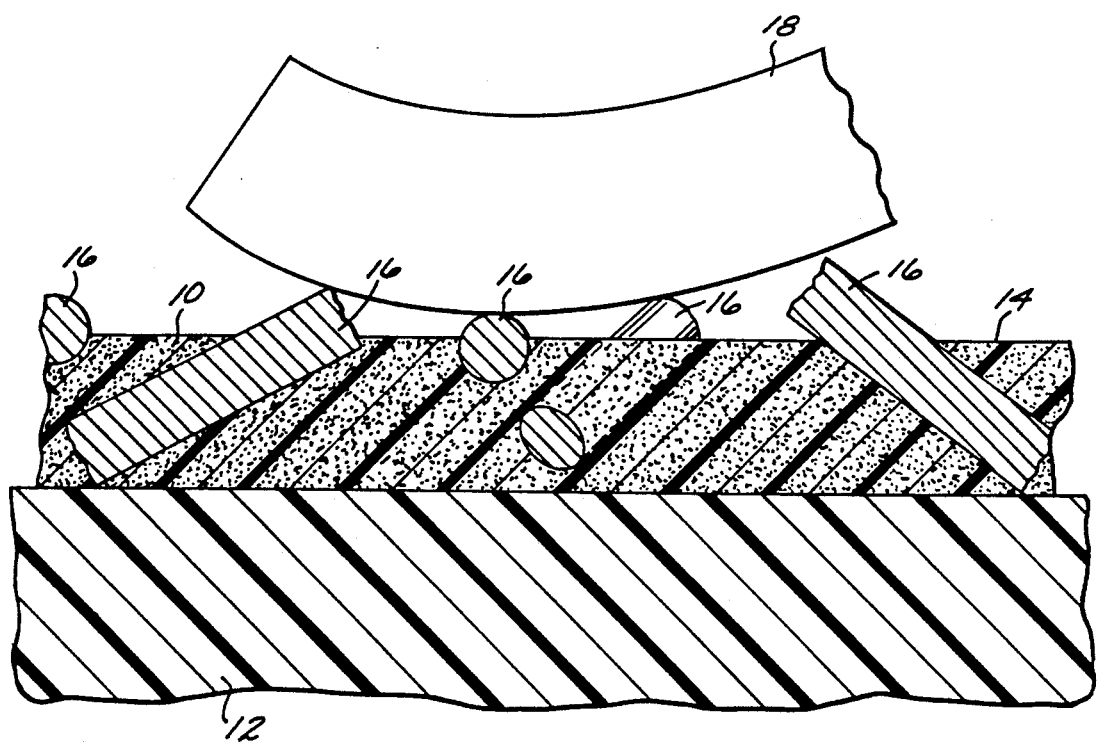
FIG. 1 is a cross-sectional schematic representation of an electrically conductive polymer thick film in accordance with the present invention.

Referring now to FIG. 1 of the appended drawings, a layer or film 10 of cured electrically conductive polymer composition of the present invention is schematically shown in an enlarged cross-section. In accordance with the state-of-the-art, the cured polymer film 10 is approximately 3 to 25 microns thick for applications in potentiometers, joy sticks and the like, and is supported by a plastic part 12 on which the film had been deposited. In a preferred embodiment of the invention, on which a number of tests have been performed to prove its extended life, the layer of cured polymeric resin film is approximately 10 microns thick.

Generally speaking, any type of polymeric resin known in the art which is suitable for application as an electrically conductive thick film in potentiometers (and like devices) can be used in the present invention, although thermally curable polymeric resins are preferred. Such resins are well known in the art. A particularly preferred embodiment of the invention utilizes thermosetting phenolic resins which include formaldehyde polymers with phenol and methylphenol. Such phenolic resins have the advantage that they are, generally speaking, well adapted for application in automotive environments. The phenolic resin based composition of a preferred embodiment of the present invention can be cured at atmospheric pressure at approximately 200° C., which temperature does not normally adversely affect the plastic part 12 on which the film 10 is deposited in a conventional process, such as silk screening, stenciling or spraying. Phenolic resins of the type which are used in the preferred embodiment of the invention are available, for example, from Occidental Chemical Co. under the name "DUREZ 000175 modified phenolic one step resin". A similar resin is also available from Georgia Pacific under the designation GP191. Other resins which are examples for application in the present invention which cure at higher temperature than the above-mentioned phenolic resins are: polyimides and diallylphthalates.

In addition to the resin, another important ingredient of the composition of the present invention comprises an electrically conductive substance which is intimately mixed with the polymeric resin to render the polymeric resin electrically conductive. This ingredient and feature of the polymeric composition is, per se, conventional and is provided substantially in accordance with the state-of-the-art. The nature of the electrically conductive substance is not critical from the stand point of the present invention; finely pulverized (submicron sized) conductive carbon pigment, graphite and even metallic powders are suitable for use in the present invention, with carbon black being used in the preferred embodiment. Carbon black obtainable from Cabot Corporation under the designations VALCAN XC-72 or BLACK PEARLS 2000, as well as carbon black obtainable from Columbian Carbon and Degussa Corporations are suitable for use in the invention.

Several specific examples of compositions made in accordance with the present invention are provided in this specification. These examples set forth the specific weight ratios (percentages by weight) of the several ingredients which are present in these exemplary compositions. Generally speaking, the conventional ingredients of the composition (such as phenolic resins, carbon black or conductive metal powder and other conventional ingredients discussed below) are present in the composition in accordance with the state-of-the-art.

FIG. 1 discloses, as the primary novel feature of the present invention, that the composition contains particulate material which is of sufficient size and is present in sufficient quantity so as to protrude from the surface 14 of the cured polymer film 10, as is shown on the drawing figure. In accordance with the preferred embodiments of the invention the particulate material is fiber, although micro-spheres (not shown), particularly precious metal coated microspheres of appropriate size are also suitable. Individual strands of fiber which are schematically shown on FIG. 1 to be substantially randomly disposed in the film 10, bear the reference numeral 16. The purpose and function of the fibers 16 (or of other particulate material such as micro-spheres) is to provide surface protrusions elevated above the general surface 14 of the film 10 whereby a wiper of a potentiometer rides on the surface while being substantially continuously in contact with the fibers 16. The wiper of a potentiometer is schematically shown on FIG. 1 and bears the reference numeral 18.

Figure 2:
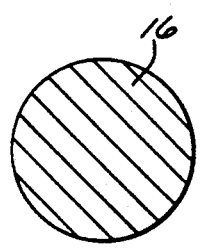
FIG. 2 is a cross-sectional view of a strand of carbon fiber used in a first preferred embodiment of the invention.
Figure 3:
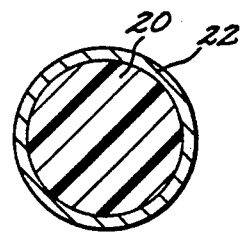
FIG. 3 is a schematic cross-sectional view of a strand of ceramic fiber coated with an electrically conductive precious metal, used in a second preferred embodiment of the present invention.

The fibers 16 which can be used in the present invention can be carbon or graphite fibers, or fibers made from mineral or ceramic materials such as alumina/silica/boria, silicon carbide or zirconia fibers, or metal fibers such as stainless steel, or steel which has been sufficiently protected from oxidation by coating of gold, silver or other precious metal alloy. Carbon fibers, which are presently most preferred in accordance with the present invention, are electrically conductive. A strand of the carbon fiber 16 is shown in cross-section on FIG. 2. When an electrically non-conductive fiber (such as a refractory fiber) is utilized in the composition of the present invention, the non-conductive fiber is coated with a thin layer of electrically conductive metal (such as silver, gold or other precious metal or metal alloy) which resists oxidation. Precious metal coated refractory fibers are available commercially in the United States for example from Potters Industries Inc. Parsippany N. J. A precious metal coated refractory fiber is schematically shown in cross-section on FIG. 3, the fiber bearing the reference numeral 20 and the thin layer of precious metal coating bearing the reference numeral 22.

The fibers utilized in the composition of the present invention generally range from approximately 0.5 micron to 20 microns in diameter, with approximately 3 to 12 microns in diameter being preferred. Individual strands of fiber contained in the composition are generally speaking less than 50 micron long, but an upper limit for the length of the fibers is preferably approximately 30 microns. Experience obtained in connection with the present invention has shown that even though the fibers are thoroughly and intimately admixed with the uncured polymer composition when the polymer composition is prepared, in the cured electrically conductive film 10 the fibers tend to be disposed randomly, but nevertheless in a manner which causes a plurality—if not the majority—of them to protrude above the surface 14 of the film. Those skilled in the art will readily appreciate that preferred dimensions of the fibers used in the present invention depend to some extent on the thickness (or height) of the polymer film 10; in the presently most preferred embodiment of the invention where the film is approximately 10 microns thick, carbon fibers are utilized which are approximately 5 to 6 microns in diameter and are less than approximately 30 microns long.

Approximately 0.25 to 10 percent by weight of the polymer film is comprised of the fibers, with the range of 1 approximately 1.0 to 5.0 percent (by weight) being preferred. The carbon fibers used in the present invention may be coated with an epoxy resin before the fibers are admixed with the rest of the ingredients comprising the composition of the present invention. Such coating with the epoxy resin is usually performed by the manufacturer of the fiber, and the coated fiber is called "sized" in the trade. Sizing is usually done to improve the strength of the interfacial bond between the fiber and the cured resin into which it is eventually incorporated. Both sized and unsized fibers are suitable for use in the present invention, and are available (typically in the 5 to 15 micron diameter range) from several manufacturers such as Thornel, DuPont, Akzo Chemical Co., Fortafil Fibers Inc., and Amoco.

In the process of manufacturing the uncured polymer composition of the present invention, the carbon fibers, sized or unsized, obtained from one or more of the above-noted commercial sources is first crushed in a cylinder-piston type cavity under a hydraulic press to reduce the length of the individual strands to less than approximately 30 microns.

Further additional and conventional ingredients which are comprised in the electrically conductive polymer compositions of the present invention are:

Solvents such as dibutyl acetate (available under the brand name EKTASOLVE from Eastman Chemical), diacetone, butyl alcohol and methyl alcohol.

Surfactants, such as xylene solution of ethyl acrylate and 2-ethylhexylacrylate co-polymer, available from Monsanto under the MULTI-FLOW trade name.

Epoxy resins, such as an epichlorohydrin and bisphenol resin available from Dow Chemical, or a 4,4-isopropylidenediphenol epichlorohydrin resin available from Shell Oil Company under the EPON 1007 designation.

Graphite powder, which serves as a solid lubricant.

Coating additives which act as agents to improve substrate wetting and ink leveling properties. These additives typical contain epoxy resins and polysiloxanes. Additional additives are defoamers which typically contain polysiloxane compounds in polyglycols. Examples of commercially available coating additives used in the actual specific compositions of the present invention are BYK160, BYK161, BYK370, BYK163, BYK022, BYK077, and BYK080 available from BYK CHEMIE of America. Examples for percentages of the above-noted conventional components of the composition are given below in connection with the Specific Examples.

The above-noted components of the novel composition of the present invention, including the carbon fibers crushed approximately 30 micron in length, are thoroughly admixed with one another, substantially similarly to the manner in which electrically conductive polymer compositions for use in potentiometers and the like are normally made in the art. Thus, the coating additives including the wetting agents are usually added to the resin before the electrically conductive powder, (preferably carbon black) and the fiber are added. After thorough mixing of all components in a blade agitated mixer the composition is preferably mixed further in a roller mill mixer. The resulting uncured polymer composition is applied to a substrate, such as a plastic part, by such conventional means as silk screening, stenciling or spraying. The film is cured on the part in a conventional manner, for example the film of the preferred embodiment which contains the epoxy modified phenolic resin is cured by exposure to approximately 200° C. for approximately two hours at atmospheric pressure.

Actual tests have been performed on potentiometers incorporating the novel cured electrically conductive film of the present invention, in test equipment where the potentiometer was subjected to repeated prolonged cycling (back and forth arcuate movement of a contact wiper on the film) at approximately 2 cycles per second. Potentiometers incorporating the present invention were also subjected to prolonged dither (up to 60 cycles per second) of the wiper on the film. Dither in this regard is understood to mean rapid back and forth movement of the wiper in a small arc, such as ±5°. The electrical resistive characteristics of the potentiometer were monitored during the tests to see how these characteristics change with prolonged cycling or dither. These tests have demonstrated that the potentiometers incorporating the invention perform for several million cycles in a substantially unimpaired manner. In other words, potentiometers of the present invention have low and stable contact resistance and a greatly extended life compared to the prior art. This increased life is manifested in less wear on the film and on the wiper, significantly less generation of debris, and less physical damage to the film, i. e. less cracking and peeling of the film.

Figure 4:
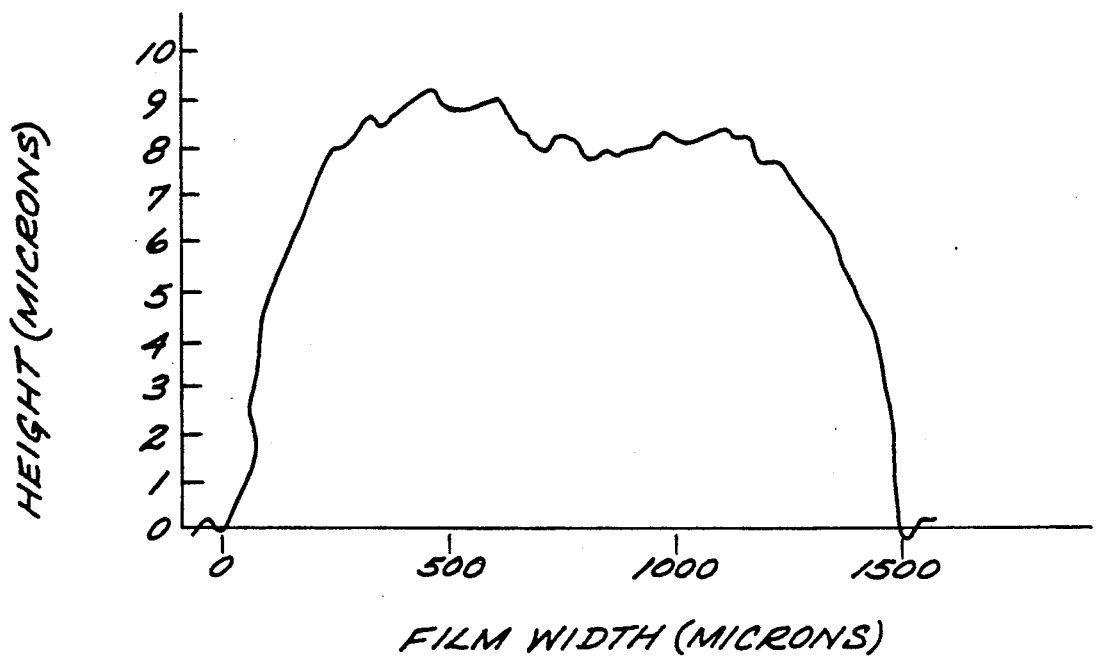
FIG. 4 is a graph showing the surface profile, as actually measured with a surface profilometer, of an electrically conductive thick film used in potentiometers and like devices, in accordance with the prior art.
Figure 5:
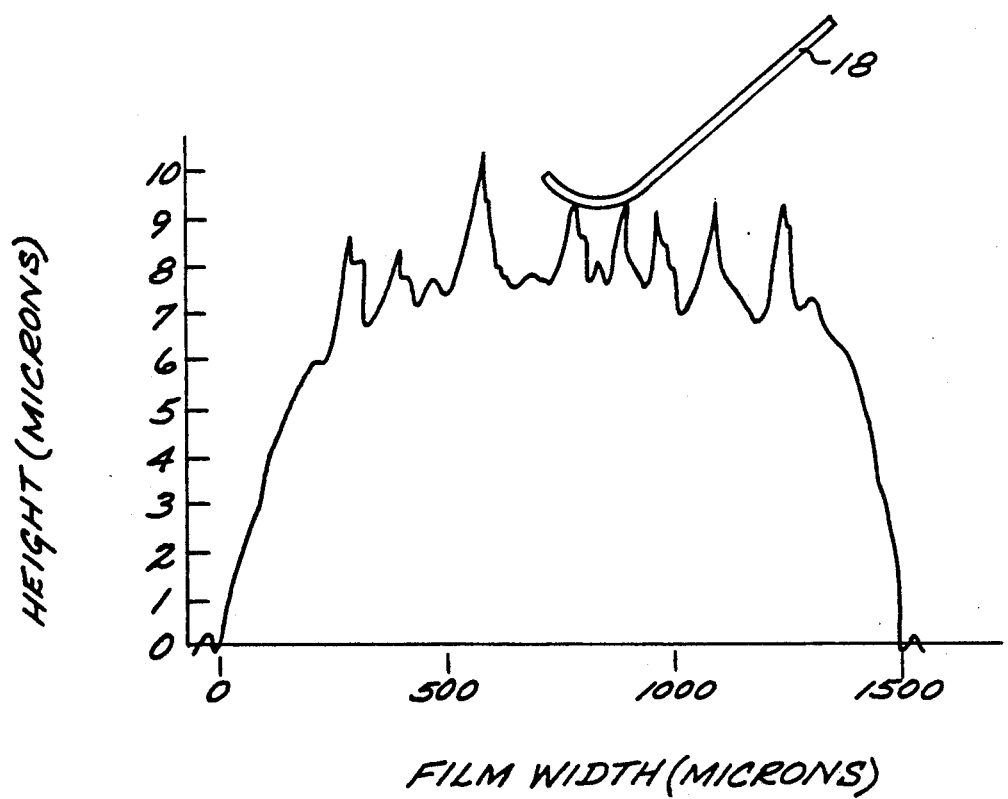
FIG. 5 is a graph showing the surface profile, as actually measured with a surface profilometer, of an electrically conductive thick film in accordance with the present invention.

Significantly and surprisingly, the improved qualities of the cured polymeric films of the present invention (and of the potentiometers which incorporate them) do not appear to be caused by increased strength of the film due to reinforcement with fiber. Rather, the improved qualities and advantages are attained because the wiper tends to ride in contact with the protruding fibers, rather than merely in contact with the surface of the film. FIG. 4 shows an actual profile of a prior art electrically conductive polymeric film, and FIG. 5 shows an actual profile of the preferred embodiment (containing carbon fiber) of the film of the present invention. The data shown on FIGS. 4 and 5 were obtained by a profilometer. A contact wiper 18 which is primarily in contact with the "peaks" in the profile is schematically shown on FIG. 5. The "peaks" in the profile correspond to the fibers protruding from the surface.

As it will be readily recognized by those skilled in the art, the present invention can be used advantageously not only strictly in potentiometers, but in several types of electrical and electronic devices where a sliding and moving wiper is in contact with a resistive conductive layer. Potentiometer "sensors", such as the sensors used in a joy stick for electronic games, are prime examples for applications of the invention.

SPECIFIC EXAMPLES

Composition 1 (percentages by weight in uncured formulation)

Phenolic resin 62.79, solvent 15.77, surfactant 0.96, graphite 2.4, carbon black 17.12, fiber #1 0.96.

Composition 2 (percentages by weight in uncured formulation)

Phenolic resin 65.3, solvent 12.4, surfactant 1, graphite 2.5, carbon 17.8 and fiber #2 1.

Composition 3 (percentages by weight in uncured formulation)

Phenolic resin 66, solvent 12.4, surfactant 1, graphite 1.25, carbon 18.6, fiber #2 0.75.

Composition 4 (percentages by weight in uncured formulation)

Phenolic resin 51, solvent 12.4, surfactant 1, epoxy 15, graphite 1.25, carbon 18.6, fiber #2 0.75.

Composition 5 (percentages by weight in uncured formulation)

Phenolic resin 66, solvent 12.4, surfactant 1, graphite 1.25, carbon 18.6, fiber #3 0.75.

Composition 6 (percentages by weight in uncured formulation)

Phenolic resin 66, solvent 12.4, surfactant 1, graphite 1.25, carbon 18.6, fiber #4 0.75.

Composition 7 (percentages by weight in uncured formulation)

Phenolic resin 55.86, solvent 10.49, surfactant 0.85, graphite 0.85, carbon 15.74, fiber #3 0.47, BYK160 15.74.

Composition 8 (percentages by weight in uncured formulation)

Phenolic resin 55.86, solvent 10.49, surfactant 0.85, graphite 0.85, carbon 15.74, fiber #3 0.47, BYK161 15.74.

Composition 9 (percentages by weight in uncured formulation)

Phenolic resin 51.05, solvent 12.69, surfactant 0.77, graphite 0.77, carbon 14.39, fiber #4 1, BYK163 19.33.

Composition 10 (percentages by weight in uncured formulation)

Phenolic resin 54.5, solvent 10.25, surfactant 0.82, graphite 0.82, carbon 15.35, fiber #4 0.95, BYK163 15.35, BYK370 1.96.

Composition 11 (percentages by weight in uncured formulation)

Phenolic resin 50.2, solvent 12.5, surfactant 1, graphite 0.7, carbon 14.3, fiber #4 2, BYK163 19, BYK022 0.3.

Composition 12 (percentages by weight in uncured formulation)

Phenolic resin 50.2, solvent 12.5, surfactant 1, graphite 0.7, carbon 14.3, fiber #4 2, BYK163 19, BYK077 0.3.

Composition 13 (percentages by weight in uncured formulation)

Phenolic resin 50.2, solvent 12.5, surfactant 1, graphite 0.7, carbon 14.3, fiber #4 2, BYK163 19, BYK080 0.3.

In the specific examples:

Fiber #1 is sized fiber;

Fiber #2 is unsized fiber;

Fiber #3 is sized fiber from Fortafil Fibers Inc;

Fiber #4 is unsized fiber from Fortafil Fibers Inc;

BYK160 is a dispersing (wetting) agent for powders containing xylene, n-butyl acetate as solvents and blocked copolymers with pigment affinity groups.

BYK161 is a dispersing (wetting) agent for powders containing n-butyl acetate, propylene glycol, monomethyl ether acetate as solvents and blocked copolymers with pigment affinity groups.

BYK163 is similar in composition to BYK160 but contains DMA also.

BYK370 contains polyester modified hydroxy functional polidimethyl siloxane, and xylene, naphtha, cyclohexanone and mono phenylglycol as solvents.

BYK022 is a defoamer containing polysiloxane in polyglycols;

BYK077 is a defoamer containing polysiloxane in polyglycols, and

BYK080 is a defoamer containing polysiloxane in polyglycols.

Several modifications of the present invention may become readily apparent to those skilled in the art in light of the foregoing disclosure. Therefore, the scope of the present invention should be interpreted solely from the following claims, as such claims are read in light of the disclosure.

What is claimed is:

1. An electrically conductive polymer film for incorporation in a potentiometer where the film is contacted by a movable wiper required to stay in contact with the film, the film comprising:

a cured polymeric resin;

an electrically conductive substance mixed in sufficient quantity with the polymeric resin to render the polymeric resin electrically conductive; and means for reducing wiper-induced wear on the film, comprising particles selected from a group consisting of fibers and spheres, said particles being mixed with the polymeric resin, the particles being of sufficient quantity and size to protrude from the surface of the film to render the surface uneven on the micro scale whereby a wiper of a potentiometer which incorporates the film moves on the film substantially continuously in contact with the particles, thereby substantially reducing the amount of contact between the wiper and the surface of the film.

2. The electrically conductive polymer film of claim 1 where the particles are fibers.

3. The electrically conductive polymer film of claim 2 where the film is approximately 3 to 25 microns thick.

4. The electrically conductive polymer film of claim 2 where the fibers are approximately 0.5 to 20 microns on diameter.

5. The electrically conductive polymer film of claim 2 where individual strands of fiber are 50 microns or less in length.

6. The electrically conductive polymer film of claim 2 where the fiber is carbon fiber.

7. The electrically conductive polymer film of claim 2 where the film is approximately 3 to 25 microns thick and where the fibers are approximately 0.5 micron to 20 microns in diameter.

8. The electrically conductive polymer film of claim 7 where individual strands of fiber are 50 microns or less in length.

9. The electrically conductive polymer film of claim 8 where the fiber is carbon fiber.

10. The electrically conductive polymer film of claim 9 where the cured polymeric resin comprises a thermally cured epoxy modified phenolic resin.

11. The electrically conductive polymer film of claim 1 wherein the particles comprise electrically conductive material.

12. The electrically conductive polymer film of claim wherein the particles comprise electrically non-conductive material coated with an electrically conductive metal.

13. The electrically conductive polymer film of claim 12 wherein the metal is selected from a group consisting of silver, gold, and precious metal alloys.

14. An electrically conductive polymer film for incorporation in a potentiometer where the film is contacted by a movable wiper required to stay in electrical contact with the film, the film comprising:
a cured polymeric resin of approximately 3 to 25 microns thickness;
an electrically conductive substance mixed in sufficient quantity with the polymeric resin to render the polymeric resin electrically conductive; and
means for reducing wiper-induced wear on the film, comprising carbon fibers mixed with the polymeric resin, the fibers being of approximately 0.5 to 20 microns in diameter and of sufficient quantity and length to protrude from the surface of the film to render the surface uneven on the micro scale whereby a wiper of a potentiometer which incorporates the film moves substantially continuously in contact with the fibers protruding from the surface thereby substantially reducing the amount of contact between the wiper and the surface of the film.

15. The electrically conductive polymer film of claim 14 where the carbon fibers comprise approximately 0.25% to approximately 10% by weight of the film.

16. The electrically conductive polymer film of claim 15 where the carbon fibers comprise approximately 1.0% to approximately 5% by weight of the film.

17. The electrically conductive polymer film of claim 15 where individual strands of fiber are 50 microns or less in length.

18. The electrically conductive polymer film of claim 15 where the cured polymeric resin comprises epoxy modified phenolic resin.

19. In a potentiometer having a base surface, an electrically conductive polymer film disposed on the base surface; a wiper which is in contact with the film and is capable of moving on the film, the film comprising a cured polymeric resin and an electrically conductive substance mixed in sufficient quantity with the polymeric resin to render the polymeric resin electrically conductive, the improvement comprising:

means for reducing the wiper-induced wear on the film, comprising particles selected from a group consisting of fibers and spheres, said particles being mixed with the polymeric resin, the particles being of sufficient quantity and size to protrude from the surface of the film to render the surface uneven on the micro scale whereby the wiper of the potentiometer moves on the film substantially continuously in contact with the particles, thereby substantially reducing the amount of contact between the wiper and the surface of the film.

20. The improvement of claim 19 where the particles are fibers.

21. The improvement of claim 20 where the particles are carbon fibers.

22. The improvement of claim 19 where the particles comprise electrically non-conductive material.

23. The improvement of claim 22 where the electrically non-conductive material of the particles is coated with a metal.

24. The improvement of claim 23 where the metal is selected from a group consisting of silver, gold and precious metal alloys.

25. The improvement of claim 19 where the electrically conductive polymer film is approximately 3 to 25 microns thick, and where the particles are carbon fibers approximately of 0.5 to 20 microns in diameter.

26. The improvement of claim 25 where individual strands of the carbon fibers are approximately 50 microns or less in length.

27. The improvement of claim 26 where the carbon fibers are approximately 3 to 12 microns in diameter.

28. The improvement of claim 25 where the carbon fibers comprise approximately 0.25% to 10% by weight of the weight of the polymeric film.

29. In potentiometer having a base surface; an electrically conductive polymer film of approximately 3 to 25 microns thickness disposed on the base surface; a wiper which is in contact with the film and is capable of moving on the film, the polymer film comprising a cured polymeric resin and an electrically conductive substance mixed in sufficient quantity with the polymeric resin to render the polymeric resin electrically conductive, the improvement comprising:

means for reducing the wiper-induced wear on the film, comprising fibers of approximately 0.5 to 20 microns diameter mixed with the polymeric resin in sufficient quantity, and of sufficient, length, to protrude from the surface of the film to render the surface uneven on the micro scale whereby the wiper of the potentiometer moves on the film substantially continuously in contact with the fibers, thereby substantially reducing the amount of contact between the wiper and the surface of the film.

30. The improvement of claim 29 where the fibers are carbon.

31. The improvement of claim 30 where the carbon fibers comprise approximately 0.25% to 10% by weight of the weight of the film.

32. The improvement of claim 31 where the carbon fibers comprise approximately 1% to approximately 5% by weight of the film.

33. The improvement of claim 30 where individual strands of fibers are 50 microns or less in length.

34. The improvement of claim 30 where the cured polymeric resin comprises an epoxy modified phenolic resin.

* * * * *